United States Patent
Zheng

(10) Patent No.: US 7,233,042 B2
(45) Date of Patent: Jun. 19, 2007

(54) METHOD OF FORMING INSIDE ROUGH AND OUTSIDE SMOOTH HSG ELECTRODES AND CAPACITOR STRUCTURE

(75) Inventor: Lingyi A Zheng, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 104 days.

(21) Appl. No.: 10/180,186

(22) Filed: Jun. 26, 2002

(65) Prior Publication Data

US 2003/0067029 A1    Apr. 10, 2003

Related U.S. Application Data

(62) Division of application No. 09/973,505, filed on Oct. 9, 2001, now Pat. No. 6,653,199.

(51) Int. Cl.
| | |
|---|---|
| *H01L 27/108* | (2006.01) |
| *H01L 29/76* | (2006.01) |
| *H01L 29/94* | (2006.01) |
| *H01L 31/119* | (2006.01) |

(52) U.S. Cl. .................................... 257/309; 257/306
(58) Field of Classification Search ........ 257/295–310, 257/532, 534; 438/3, 241–254, 396–398
See application file for complete search history.

(56) References Cited

U.S. PATENT DOCUMENTS

| | | | |
|---|---|---|---|
| 5,102,832 A | 4/1992 | Tuttle | 437/231 |
| 5,112,773 A | 5/1992 | Tuttle | 437/109 |
| 5,202,278 A | 4/1993 | Mathews et al. | 437/47 |
| 5,320,880 A | 6/1994 | Sandhu et al. | 427/578 |
| 5,587,103 A | 12/1996 | Dennis | 134/3 |
| 5,792,689 A * | 8/1998 | Yang et al. | 438/253 |
| 5,869,391 A | 2/1999 | Manning | 438/618 |
| 5,985,732 A * | 11/1999 | Fazan et al. | 438/398 |
| 6,025,624 A * | 2/2000 | Figura | 257/306 |
| 6,046,083 A * | 4/2000 | Lin et al. | 438/255 |
| 6,046,093 A * | 4/2000 | DeBoer et al. | 438/398 |
| 6,048,763 A | 4/2000 | Doan et al. | 438/239 |
| 6,159,818 A | 12/2000 | Durcan et al. | 438/387 |
| 6,200,898 B1 * | 3/2001 | Tu | 438/692 |

(Continued)

OTHER PUBLICATIONS

Michael Quirk, Semiconductor Manufacturing Technology (2001), Prentice Hall, First Edition, p. 465.

*Primary Examiner*—Cuong Nguyen
(74) *Attorney, Agent, or Firm*—Whyte Hirschboeck Dudek SC

(57) ABSTRACT

A container capacitor and method of forming the container capacitor are provided. The container capacitor comprises a lower electrode fabricated by forming a layer of doped polysilicon within a container in an insulative layer disposed on a substrate; forming a barrier layer over the polysilicon layer within the container; removing the insulative layer to expose the polysilicon layer outside the container; nitridizing the exposed polysilicon layer at a low temperature, preferably by remote plasma nitridation; removing the barrier layer to expose the inner surface of the polysilicon layer within the container; and forming HSG polysilicon over the inner surface of the polysilicon layer. The capacitor can be completed by forming a dielectric layer over the lower electrode, and an upper electrode over the dielectric layer. The cup-shaped bottom electrode formed within the container defines an interior surface comprising HSG polysilicon, and an exterior surface comprising smooth polysilicon.

7 Claims, 5 Drawing Sheets

U.S. PATENT DOCUMENTS 6,255,159 B1 * 7/2001 Thakur ........................ 438/253
6,451,662 B1   9/2002 Chudzik et al. ............ 438/240

2002/0185672 A1 * 12/2002 Higashino ................... 257/309

* cited by examiner

METHOD OF FORMING INSIDE ROUGH AND OUTSIDE SMOOTH HSG ELECTRODES AND CAPACITOR STRUCTURE

FIELD OF THE INVENTION

The invention relates generally to semiconductor fabrication and, more particularly to capacitor container structures.

BACKGROUND OF THE INVENTION

Continuing advances in miniaturization and densification of integrated circuits have led to smaller areas available for devices such as transistors and capacitors. With shrinkage of the cell size, maintaining a sufficient amount of cell charge storage capacitance is a challenge in a dynamic random access memory (DRAM).

Several techniques have been developed to increase the storage capacity of a capacitor in a limited space. One such technique is to fabricate a cup-shaped bottom electrode defining an interior surface and an exterior surface within a container formed in an insulative layer. A recess between adjacent bottom electrodes is formed in the insulating layer to expose a portion of the electrodes' exterior surfaces. A capacitor dielectric and then a top electrode are deposited over the interior of the cup-shaped bottom electrode and the interior of the recess. The structure provides additional capacitance.

Conventionally, the bottom electrode is formed of N-type hemispherical grain silicon (HSG). Using a double-sided HSG bottom electrode provides a higher surface area for increased capacitance. However, the growth of HSG on the exterior container surface can cause cell to cell shorts, requiring the space between containers to be enlarged.

Thus, a need exists for a structure and process therefor that overcomes such problems.

SUMMARY OF THE INVENTION

The present invention provides capacitor structures and methods of forming such structures.

In one aspect, the invention provides methods for forming a container capacitor. In one embodiment of the method, the lower electrode of the capacitor is fabricated by forming a layer of doped polysilicon within a container in an insulative layer disposed on a substrate; forming a barrier layer over the polysilicon layer within the container; removing the insulative layer to expose the polysilicon layer outside the container; nitridizing the exposed polysilicon layer at a low temperature, preferably at about 550° C. or less and by remote plasma nitridation; removing the barrier layer to expose the polysilicon layer within the container; optionally cleaning the exposed polysilicon layer to remove native oxide and remaining barrier layer using a wet etch selective to the nitride layer overlying the exterior surface of the polysilicon layer; and forming HSG polysilicon over the polysilicon layer within the opening. The capacitor can be completed by forming a dielectric layer over the lower electrode, and an upper electrode over the dielectric layer.

In another embodiment of the method, a plurality of capacitors can be formed on a semiconductor substrate. The capacitors can be fabricated by forming a conformal layer of doped polysilicon over an insulative layer disposed on a substrate and within a plurality of containers formed in the insulative layer; depositing a conformal layer of a barrier material over the polysilicon layer; removing the barrier layer and the polysilicon layer overlying the insulative layer outside the containers; removing the insulative layer to expose the exterior surfaces of the polysilicon layer outside the containers and form a recess between adjacent bottom electrodes; nitridizing the exterior surface of the polysilicon layer outside the containers, preferably by remote plasma nitridation at a temperature of about 550° C. or less to form a nitride layer; removing the barrier layers from the interior surface of the polysilicon layer within the containers; optionally cleaning the interior surface of the polysilicon layer within the containers; and forming HSG polysilicon over the polysilicon layer within the containers. The capacitor can be completed by forming a dielectric layer over the lower electrodes and into the recesses between electrodes, and an upper electrode over the dielectric layer.

In another aspect, the invention provides a container capacitor. In one embodiment, the capacitor comprises a cup-shaped bottom electrode defining an interior surface and an exterior surface within a container formed in an insulative layer; the interior surface comprising HSG polysilicon, and the exterior surface comprising smooth polysilicon. The bottom electrode is preferably 300 to about 400 angstroms. The capacitor can further comprises a dielectric layer overlying the inner and outer surfaces of the bottom electrode; and a top electrode overlying the dielectric layer. The cup-shaped bottom electrode can be, for example, circular, square, rectangular, trapezoidal, triangular, oval, or rhomboidal shaped, in a top down view.

In yet another aspect, the invention provides a semiconductor device. In one embodiment, the semiconductor device comprises a plurality of cup-shaped bottom electrodes, each electrode defining an interior surface and an exterior surface within a container formed in an insulative layer; the interior surface comprising HSG polysilicon, and the exterior surface comprising smooth polysilicon; a recess formed within the insulative layer between adjacent electrodes; a dielectric layer disposed over the bottom electrodes and the recess between the adjacent electrodes; and a top electrode disposed over the dielectric layer. The bottom electrodes can be, for example, circular, square, rectangular, trapezoidal, triangular, oval, or rhomboidal shaped, in a top down view. In another embodiment of the semiconductor device, an etch stop layer (e.g., silicon nitride) can underlie the insulative layer, and the recess within the insulative layer between adjacent electrodes can be formed to the etch stop layer.

Advantageously, the present invention provides for the manufacture of a double-sided electrode having a smooth outer surface and a rough inner surface, which enables an increase in container critical dimensions (CD) and capacitance and provides a capacitor having a large electrode surface area. The invention also proves a semiconductor device comprising multiple closely-spaced capacitors for increased density of the device.

BRIEF DESCRIPTION OF THE DRAWINGS

Preferred embodiments of the invention are described below with reference to the following accompanying drawings, which are for illustrative purposes only. Throughout the following views, the reference numerals will be used in the drawings, and the same reference numerals will be used throughout the several views and in the description to indicate same or like parts.

DETAILED DESCRIPTION OF THE PREFERRED EMBODIMENTS

The invention will be described generally with reference to the drawings for the purpose of illustrating the present preferred embodiments only and not for purposes of limiting the same. The figures illustrate processing steps for use in the fabrication of semiconductor devices in accordance with the present invention. It should be readily apparent that the processing steps are only a portion of the entire fabrication process.

In the current application, the terms "semiconductive wafer fragment" or "wafer fragment" or "wafer" will be understood to mean any construction comprising semiconductor material, including but not limited to bulk semiconductive materials such as a semiconductor wafer (either alone or in assemblies comprising other materials thereon), and semiconductive material layers (either alone or in assemblies comprising other materials). The term "substrate" refers to any supporting structure including, but not limited to, the semiconductive wafer fragments or wafers described above.

An embodiment of a method of the present invention is described with reference to FIGS. 1–10, in a method of forming a capacitor.

Figure 1:
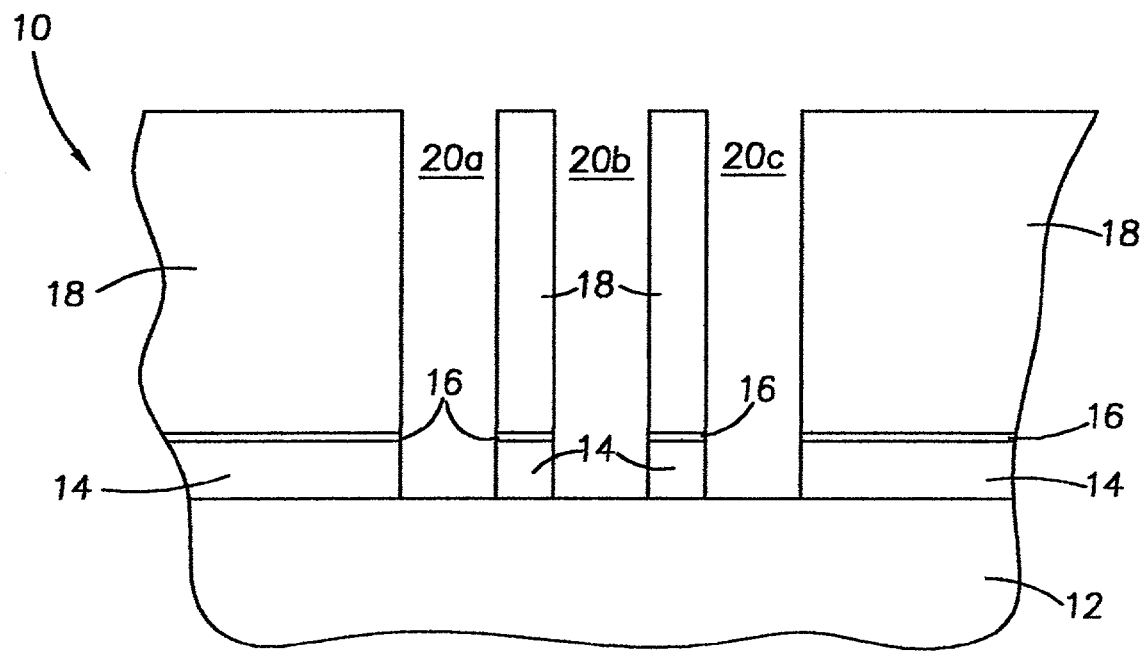
FIG. 1 is a diagrammatic cross-sectional view of a semiconductor wafer fragment at a preliminary step of a processing sequence.

Referring to FIG. 1, a portion of a semiconductor wafer 10 is shown at a preliminary processing step. The wafer fragment 10 in progress can comprise a semiconductor wafer substrate or the wafer along with various process layers formed thereon, including one or more semiconductor layers or other formations, and active or operable portions of semiconductor devices.

The wafer fragment 10 is shown as comprising a substrate 12, a first insulative layer 14, a wet etch stop layer 16, and a second overlying insulative layer 18. An exemplary substrate 12 is monocrystalline silicon that is lightly doped with a conductivity enhancing material. Exemplary insulative materials include silicon dioxide ($SiO_2$), phosphosilicate glass (PSG), borosilicate glass (BSG), and borophosphosilicate glass (BPSG), in a single layer or multiple layers, with the insulative layers 14, 18, being BPSG in the illustrated example. Multiple containers or openings 20a–c have been conventionally dry etched through the first and second BPSG insulative layers 14, 18, and the wet etch stop layer 16 to an active area in the substrate 12 using a dry etch process using, for example, $CF_4$, $C_4F_6$, among others.

The wet etch stop layer 16, which is conformally deposited over the first insulative layer 14, has a characteristic etch rate in which etchants will selectively remove the second insulative layer 18 in a later processing step without significantly etching the etch stop layer 16 in a later wet etch processing step. The wet etch stop layer 16 can comprise, for example, silicon nitride ($SiN_x$) at about 100 to about 200 angstroms, or silicon dioxide formed by decomposition of a tetraethylorthosilicate (TEOS) precursor at about 500 to about 1000 angstroms.

Figure 2:
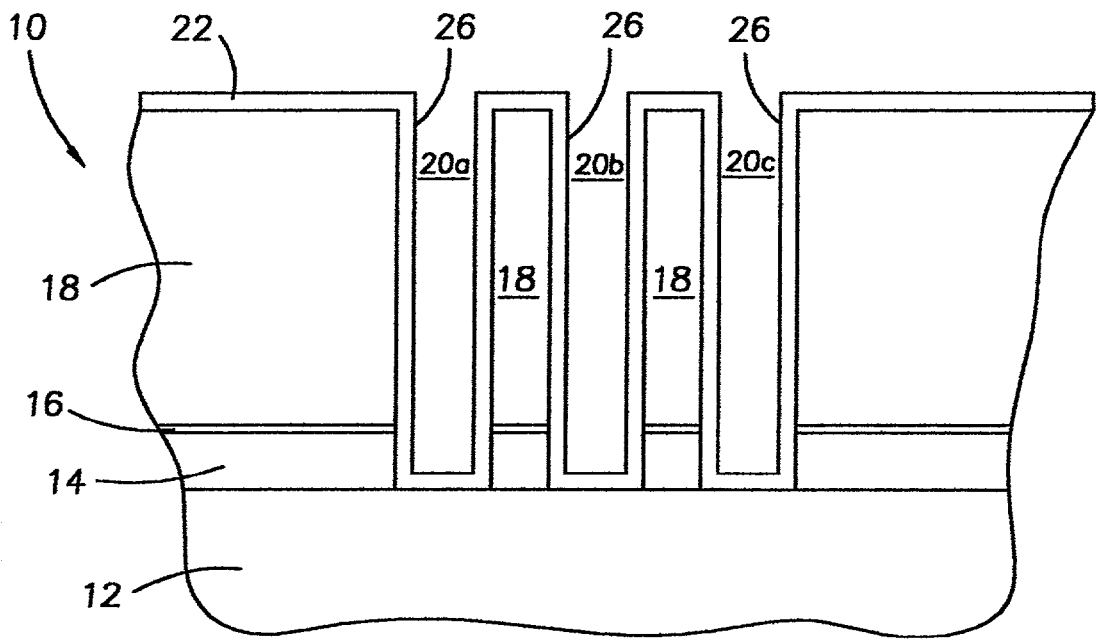
FIGS. 2–10 are views of the wafer fragment of FIG. 1 at subsequent and sequential processing steps, showing fabrication of a capacitor according to an embodiment of the method of the invention.

Referring to FIG. 2, a layer 22 of smooth, conductively doped polysilicon is conformally deposited over the BPSG insulative layer 18 and within each of the openings 20a–c of each container capacitor structure, to form a cup-shaped structure (lower electrode) within the openings. By cup-shaped, it is understood to include any of circular, square, rectangular, trapezoidal, triangular, oval, or rhomboidal, among other shapes, with respect to the top down view of the lower electrodes.

The polysilicon electrode layer 22 can be deposited from a silicon source material such as dichlorosilane ($SiH_2Cl_2$, DCS), silicon tetrachloride ($SiCl_4$), silicon trichlorosilane ($SiHCl_3$, TCS), and a silicon precursor that contains a hydride such silane ($SiH_4$) and disilane ($Si_2H_6$). The silicon material can be deposited utilizing a known deposition process including plasma enhanced chemical vapor deposition (PECVD), low pressure chemical vapor deposition (LPCVD), and rapid thermal chemical vapor deposition (RTCVD). For example, the silicon material can be deposited by LPCVD of $SiH_4$ at a temperature of about 450° C. to about 650° C., a pressure of about 0.2 to about 1 Torr, and an $SiH_4$ flow rate of about 250 sccm, for a duration of about 20 to about 60 minutes, to a preferred thickness of about 300 to about 400 angstroms. The polysilicon can be doped during deposition or after deposition by diffusion or ion implantation.

Figure 3:
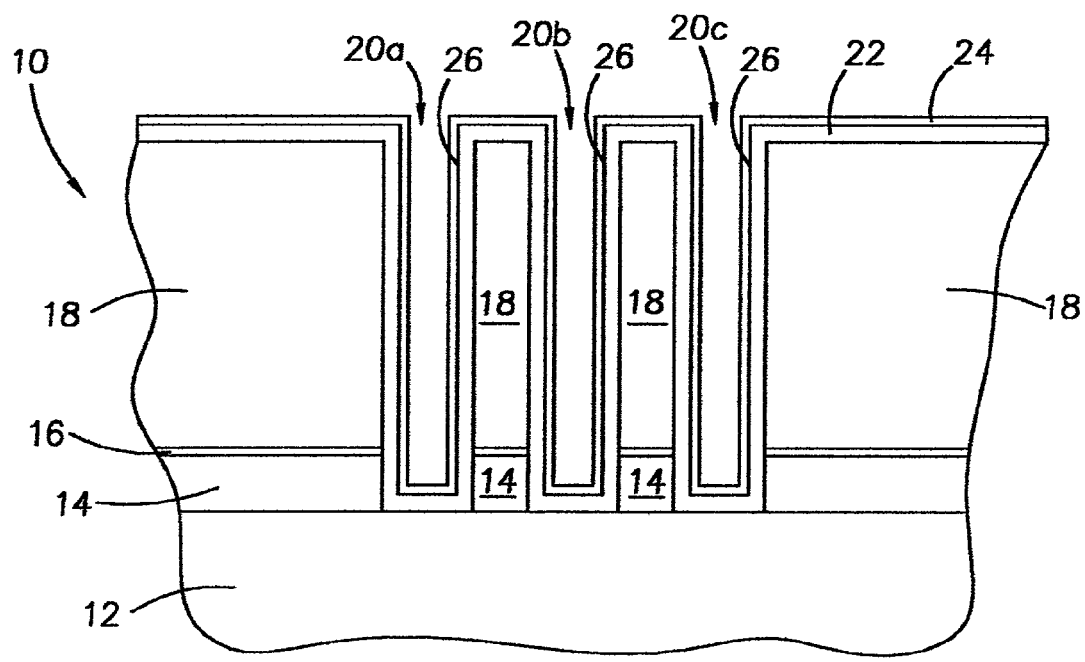

As shown in FIG. 3, a thin barrier layer 24 is then formed over the interior surface 26 of the polysilicon electrode layer 22, being titanium nitride (TiN) in the illustrated example. A TiN barrier layer 24 can be formed by a conventional thermal chemical vapor deposition (TCVD), plasma enhanced CVD (PECVD), or atomic layer deposition (ALD), utilizing a source gas comprising precursors of tetrakisdimethyl-amidotitanium (TDMAT) (($CH_3)_2N)_4Ti$) and ammonia ($NH_3$), or titanium tetrachloride ($TiCl_4$) and $NH_3$. Preferably, the titanium nitride layer 24 is about 100 to about 200 angstroms.

Figure 4:
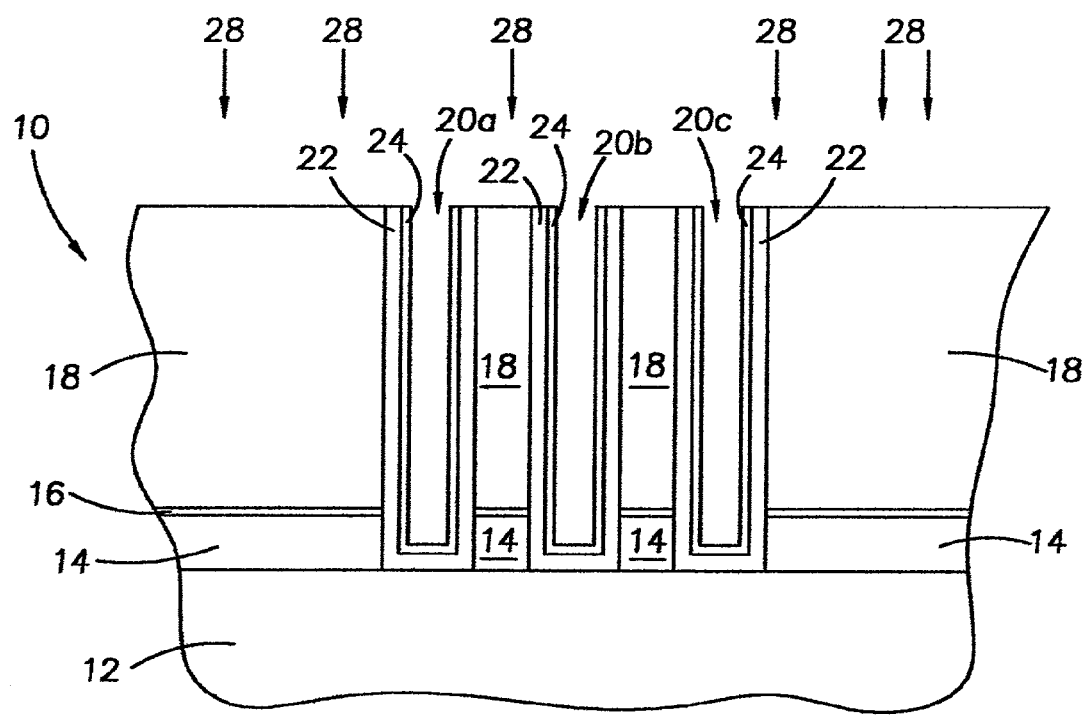

Referring to FIG. 4, the TiN barrier layer 24 and the polysilicon electrode layer 22 overlying the second BPSG insulative layer 18 and outside the openings 20a–c, are subjected to a conventional dry etch or chemical mechanical polishing (CMP) 28 to expose the upper surface of the BPSG layer 18. A suitable dry etch comprises exposing the wafer 10 to $CF_4$, $C_4F_6$, among others, at a temperature of about 25° C. to about 150° C., a pressure of about 30 to about 100 mTorr, and gas flow rate of about 30 to about 100 sccm.

Figure 5:
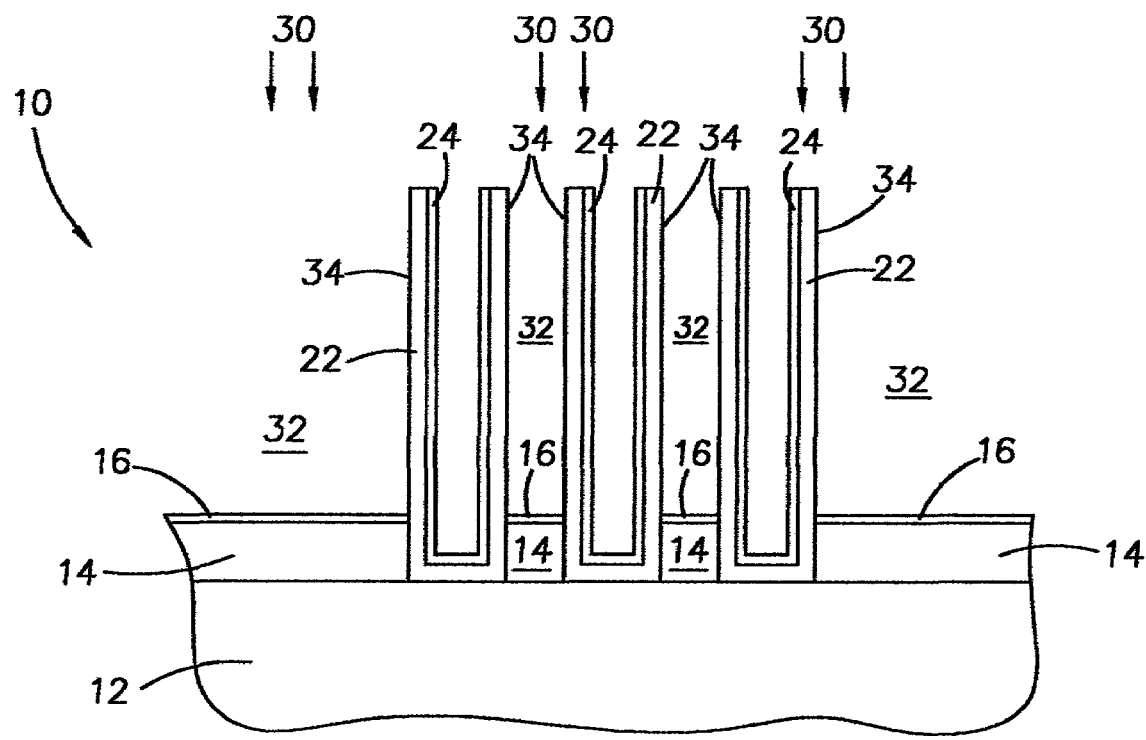

As depicted in FIG. 5, a portion of the BFSG insulative layer 18 is removed by wet etch 30 using a hydrofluoric acid (HF) solution to form an opening or recess 32 to expose the exterior surface 34 of the polysilicon lower electrode 22, resulting in a cup-shaped lower electrode structure. As shown, the insulative layer 18 has been downwardly etched to expose the nitride etch stop layer 16. The HF wet etch is selective to the TiN layer 24 and the polysilicon electrode 22. An example and preferred HF solution comprises a 10:1 HF solution. For an about 1.7 μm (17,000 angstroms) BPSG insulative layer, the etch can comprise the use of a 10:1 HF solution for about 345 seconds.

Figure 6:
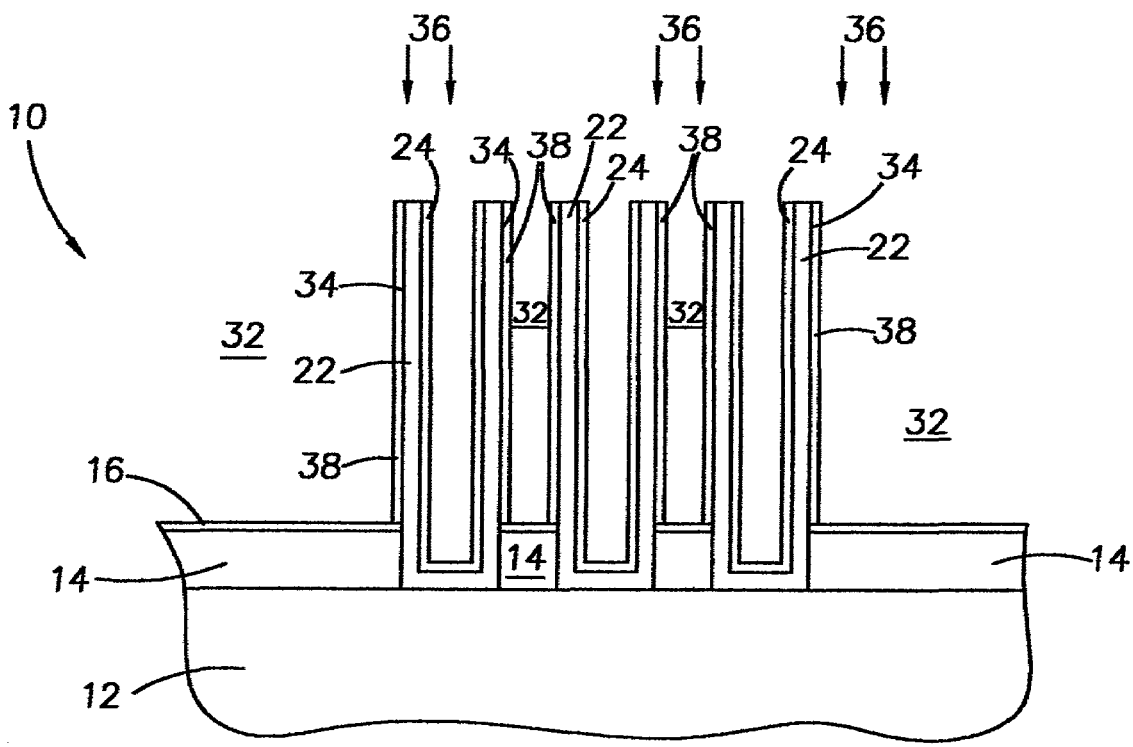

The exterior surface 34 of the polysilicon electrode layer 22 is then nitridized by exposure to a nitrogen-containing gas 36, as shown in FIG. 6, to form an overlying passivating layer 38 comprising silicon nitride ($SiN_x$). The nitridizing process step can be performed by remote plasma nitridization (RPN) or decoupled plasma nitridization (DPN) over a temperature range of about 400° C. to about 550° C. Examples of nitrogen-containing gases for use in such methods include nitrogen ($N_2$) and ammonia ($NH_3$).

An example and preferred nitridation process is a RPN at a low temperature of about 550° C. or less, a pressure of about 1 Torr to about 100 Torr, with a nitrogen precursor flow rate of about 10 sccm to about 1000 sccm, for a duration of about 5 seconds to about 5 minutes, to form a nitride layer 38 of about 15 to about 25 angstroms thick. The use of a low temperature RPN prevents the interior surface 26 of the polysilicon electrode 22 from being nitridized by the reaction of the TiN barrier layer 24 with the polysilicon.

Figure 7:
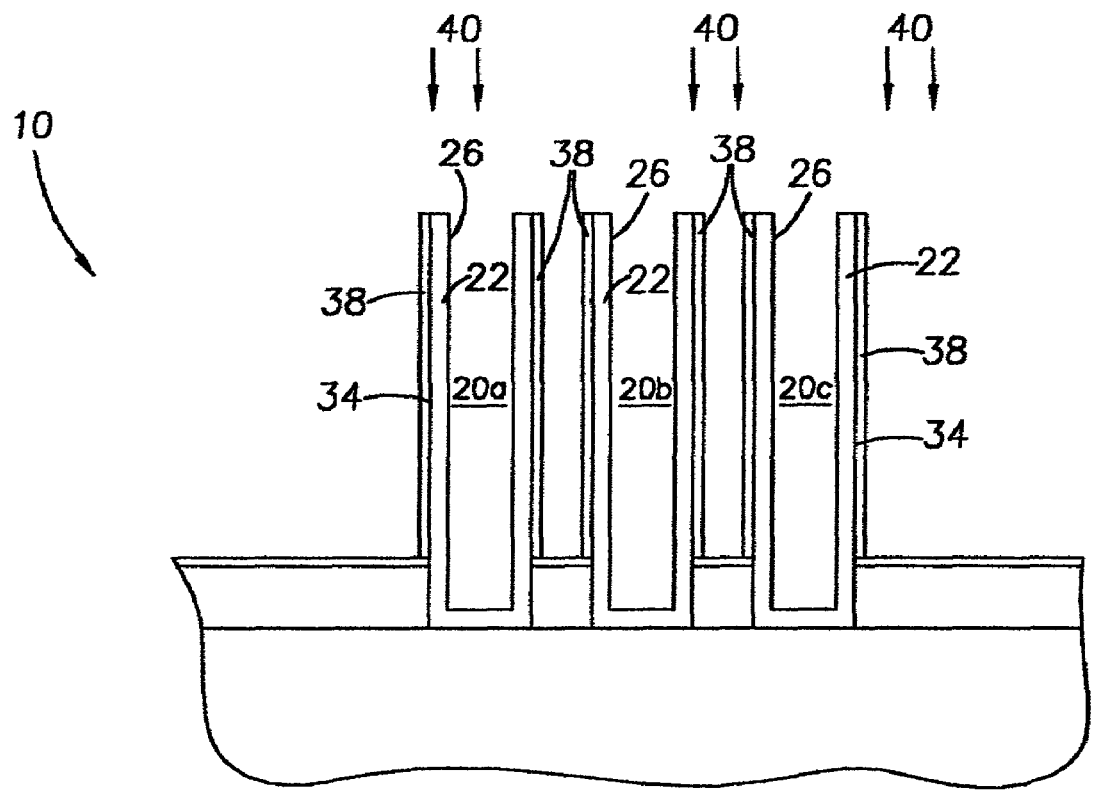

Referring to FIG. 7, the TiN barrier layer 24 is then stripped from the interior surface 26 of the polysilicon electrode 22 using a conventional piranha wet etch 40, for example, by immersing the wafer 10 in a solution of sulfuric acid ($H_2SO_4$) and an oxidant such as hydrogen peroxide ($H_2O_2$).

The wafer fragment 10 can then be subjected to a wet etch to remove native oxide and titanium silicide ($TiSi_x$) that may have formed over the interior surface 26 of the polysilicon electrode 22, and prepare the surface 26 for formation of hemispherical silicon grain (HSG) polysilicon in the next step. An example of a suitable etchant comprises a mixture of $NH_4F$ and $H_3PO_4$, which provides etch rates of native oxide, $TiSi_x$, and nitride at about 48, 50 and 2 angstroms per minute. Immersion of the wafer in the etchant solution for up to about 2 minutes, preferably about 60 to about 100 seconds, provides cleaning of the interior surface 26 of the polysilicon electrode 22 while maintaining a sufficient thickness of the RPN nitride passivating layer 38 over the exterior surface 34 of the electrode.

Figure 8:
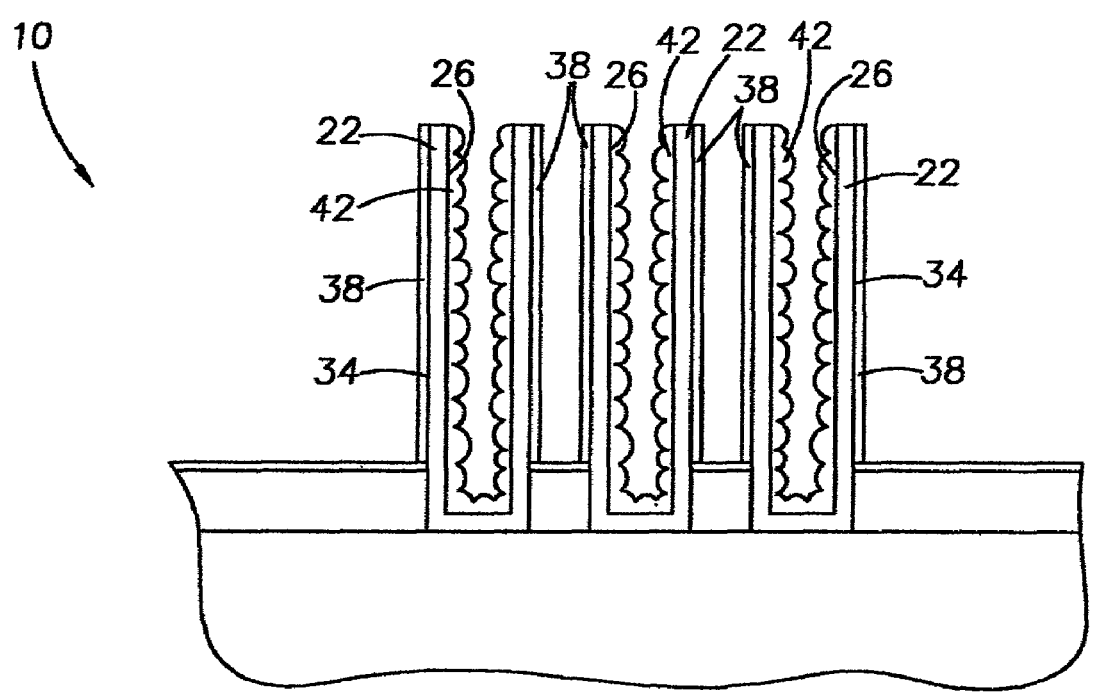

A selective HSG conversion of the interior surface 26 of the polysilicon electrode 22 is then performed, resulting in a layer 42 of HSG polysilicon, as depicted in FIG. 8. Due to the presence of the RPN nitride passivating layer 38 overlying the exterior surface 34 of the polysilicon electrode 22, HSG growth is limited to the interior surface 26 of the electrode 22, resulting in the lower electrode 22 having a smooth exterior surface 34 and a rough (HSG) interior surface 26.

HSG formation is well known in this art and many different known processes may be used in conjunction with the present invention. An example and preferred method of forming HSG is by silicon seeding and annealing in vacuum or at low pressure. To selectively create HSG on the interior surface 26 of the polysilicon electrode 22, the wafer 10 is exposed, for example, to silane or disilane, to form a seed layer of amorphous silicon, and the seed layer is then thermally annealed to convert to HSG.

Figure 9:
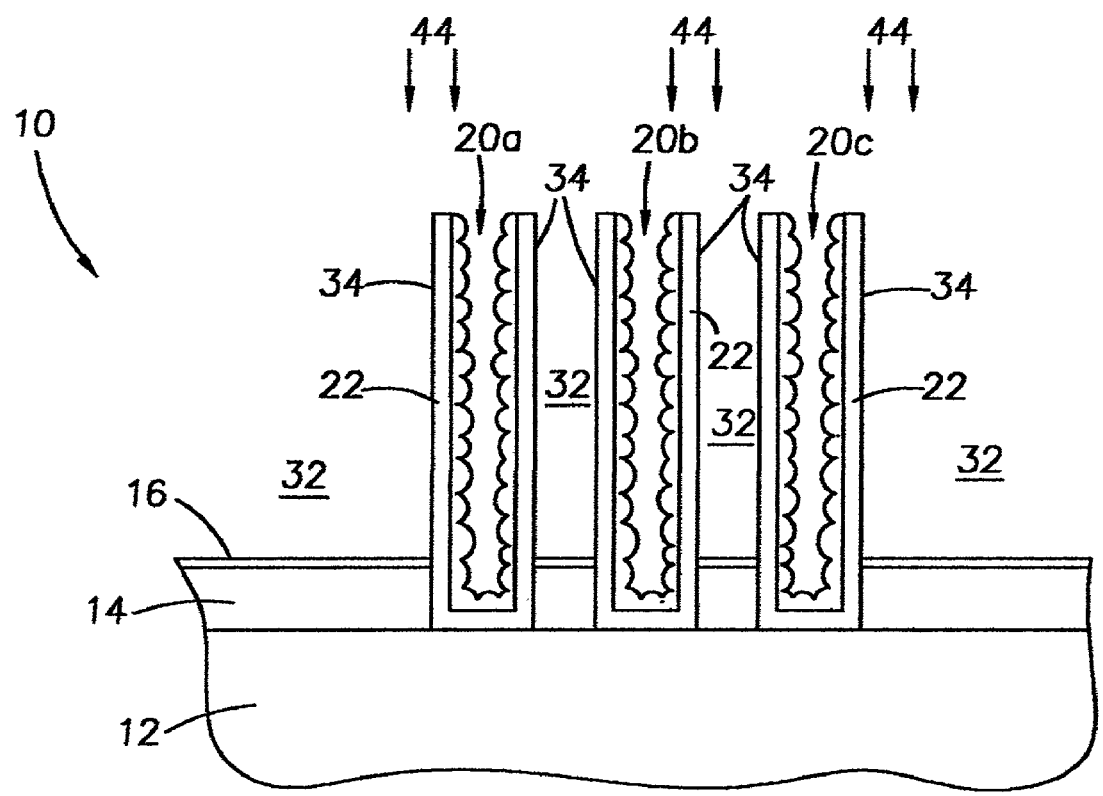

As shown in FIG. 9, a nitride wet strip 44 is then preformed to selectively etch the RPN nitride layer 38 remaining on the exterior surface 34 of the polysilicon lower electrode 22. An example of a suitable wet etch of the nitride layer 38 can be performed using a conventional hot phosphoric acid ($H_3PO_4$) strip.

The structure can then be processed by conventional methods to complete the capacitor structure.

Figure 10:
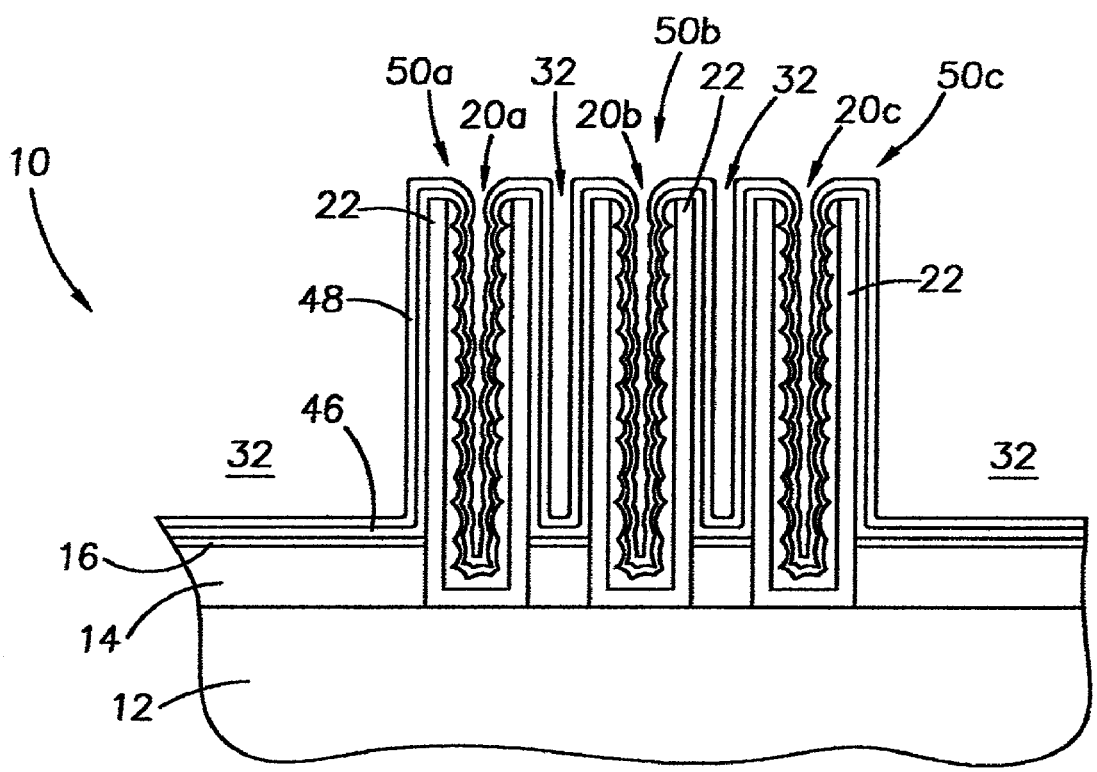

Referring to FIG. 10, a cell nitride layer 46 comprising silicon nitride ($SiN_x$) can be conformally deposited over the polysilicon lower electrode 22 and into the openings 20a–c and the recesses 32, typically by low pressure chemical vapor deposition (LPCVD) of a silicon source gas such as $SiH_2Cl_2$, $SiCl_4$, $SiH_4$, and $Si_2H_6$, and a nitrogen source gas such as $NH_3$. Conventional silicon nitride deposition processes other than LPCVD can also be used, including physical deposition, plasma enhanced chemical vapor deposition, and rapid thermal chemical vapor deposition, among others.

A conductive material can then be deposited over the cell nitride layer 46 to form the top capacitor electrode 48. The top electrode 48 can comprise a conductive material such as doped polysilicon or a conductive metal. The conductive material can be deposited on the cell nitride layer 46 and into the openings 20a–c and the recesses 32, by conventional methods, such as chemical vapor deposition (CVD), or physical vapor deposition (e.g., sputtering) for a metal plate, to complete the capacitor structures 50a–c.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. An intermediate capacitor structure, comprising:
   an electrode comprising polysilicon and defining an interior surface being roughened and comprising HSG polysilicon, and an exterior surface being substantially smooth and comprising doped polysilicon, the HSG polysilicon on the interior surface exposed, the exterior surface but not the interior surface with a thin nitride passivation layer of about 15–25 Å thereover; and an opening between the electrode and an adjacent electrode with the nitride passivation layer exposed within said opening.

2. The intermediate capacitor structure of claim 1, wherein the electrode is about 300 to about 400 angstroms thick.

3. The intermediate capacitor structure of claim 1, wherein the electrode is cup-shaped.

4. An intermediate capacitor structure, comprising:
   an electrode comprising polysilicon having a thickness of about 300–400 Å, the electrode defining an interior surface being roughened and comprising HSG polysilicon, and an exterior surface comprising smooth doped polysilicon, the HSG polysilicon on the interior surface exposed, the exterior surface but not the interior surface with a nitride layer of about 15–25 Å thereover, and an opening between the electrode and an adjacent electrode with the nitride layer exposed within said opening.

5. An intermediate capacitor structure, comprising:
   a cup-shaped electrode comprising polysilicon and defining an interior surface being roughened and comprising HSG polysilicon, and an exterior surface being smooth and comprising doped polysilicon, the HSG polysilicon on the interior surface exposed, the exterior surface but not the interior surface with a nitride passivation layer of about 15–25 Å thereover, an opening between the electrode and an adjacent electrode with the nitride passivation layer exposed within said opening, and the electrode having a thickness of about 300–400 Å.

6. An intermediate capacitor structure, comprising:
   a cup-shaped lower electrode comprising polysilicon and defining an interior surface being roughened and comprising HSG polysilicon, and an exterior surface being smooth and comprising doped polysilicon, the HSG polysilicon on the interior surface exposed, the exterior surface but not the interior surface with a thin nitride passivation layer of about 15–25 Å thereover; and a recess between the electrode and an adjacent electrode with the nitride passivation layer exposed within said recess.

7. An intermediate structure for a semiconductor device, comprising:

a cup-shaped electrode comprising polysilicon and defining an interior surface being roughened and comprising HSG polysilicon, and an exterior surface being smooth and comprising doped polysilicon, the polysilicon electrode having a thickness of about 300–400 Å the interior surface exposed, a thin nitride passivation layer of about 15–25 Å over the exterior surface but not over the interior surface, and an opening between the electrode and an adjacent electrode with the nitride passivation layer exposed within said opening.

* * * * *